United States Patent
Greenstein et al.

[15] 3,663,194

[45] May 16, 1972

[54] METHOD FOR MAKING MONOLITHIC OPTO-ELECTRONIC STRUCTURE

[72] Inventors: Bernard Greenstein, Toledo, Ohio; Perry R. Langston, Jr., Poughkeepsie, N.Y.; Bernt Narken, Poughkeepsie, N.Y.; Brian Sunners, Poughkeepsie, N.Y.

[73] Assignee: International Business Machines Corporation, Armonk, N.Y.

[22] Filed: May 25, 1970

[21] Appl. No.: 40,069

[52] U.S. Cl. ....................................65/43, 65/59, 65/DIG. 7, 350/96 T

[51] Int. Cl. ......................................C03c 29/00, C03c 27/00

[58] Field of Search .......................65/43, 59, DIG. 7; 29/472; 350/96

[56] References Cited

UNITED STATES PATENTS

| | | | |
|---|---|---|---|
| 3,516,724 | 6/1970 | Ashton et al. | 65/DIG. 7 |
| 3,535,537 | 10/1970 | Powell | 65/DIG. 7 |
| 3,556,640 | 1/1971 | Austin | 65/DIG. 7 |

*Primary Examiner*—S. Leon Bashore
*Assistant Examiner*—Robert L. Lindsay, Jr.
*Attorney*—Hanifin and Jancin and John F. Osterndorf

[57] ABSTRACT

Multilayer opto-electronic module structures and their method of fabrication. Alternate layers of light conducting material and light isolating material are formed on a substrate and on each other. Isolating bars are formed in a predetermined pattern within the layers of light conducting material to define optical channels or chambers. Suitable illuminating and detecting means may be included within the channels using the isolating materials as electrical conductors so as to perform logic, memory and display functions.

6 Claims, 5 Drawing Figures

INVENTORS
BERNARD GREENSTEIN
PERRY R. LANGSTON, JR.
BERNT NARKEN
BRIAN SUNNERS

BY John F. Ostendorf
ATTORNEY

METHOD FOR MAKING MONOLITHIC OPTO-ELECTRONIC STRUCTURE

BACKGROUND OF THE INVENTION

1. Field of the Invention

This invention relates to opto-electronic module structures and, more particularly, to multilayer monolithic lightpiping packages of optical transmitting and optical isolating materials and their method of fabrication for performing logic, memory and display functions.

2. Description of the Prior Art

Apparatus for conducting radiation in the visible light, infra-red and ultra violet ranges is well-known in the art. Devices have been constructed for forming and transmitting optical images; for encoding and decoding information; for the performance of logic functions and for the storage of information.

Such apparatus has usually been fabricated of crystalline or glass like elements in sheet, strip and fiber form. In all instances, the devices have been made using discrete elements packaged in arrays or bundles using adhesives or suitable supports. In such structures optical isolation between the elements or groups of elements is difficult to achieve. Thus, the functions which may be performed by the apparatus are limited.

SUMMARY OF THE INVENTION

As contrasted with the prior art, the method and apparatus of this invention provides a substantially simpler multilayer monolithic package of optical transmitting and optical isolating materials. The optical isolating materials may also be used as electrical conductors. The resulting monolithic package has greater packaging density and the processes for fabricating such structures are more suitable for mass production.

According to one aspect of the invention, light channels or chambers are constructed in monolithic structures. Optical isolation is provided among the chambers. Alternating layers of optically transmitting and optically isolating materials are deposited in layers first on a substrate and then on each other. Defined patterns of optical isolators are formed transversely of the layers within the transmitting material to form plural light conducting channels. Pre-determined portions of the optical isolating layers and optical isolators are eliminated providing communication to and within predetermined ones of the channels.

The optical transmitting material may be a glass with a suitable index of refraction. The glass is prepared by first suspending it in a liquid. A layer of the suspension is deposited to a desired thickness on a suitable substrate. After firing the glass layer, the optically isolating layer which is highly reflective and may be metallic is deposited on it. Metal vias or bars are then deposited on the isolating layer to provide transverse optical isolation. The spaces between the vias are filled with another glass layer. Additional glass and metallic layers are added to the structure by depositing a metallic layer after each glass layer is fired. The metal layers along with the vias or bars define the light conducting chambers or channels.

Another aspect of the invention provides for the inclusion of electroluminescent or photoemitting or photodetecting devices within the light chambers as the structures are fabricated. The metallic layers serve as the electrical conductors for the devices as well as external electrodes. Etching of the layers is used to perform electrical isolation where it is necessary. Where optical coupling between vertical and horizontal layers is desired, cut-outs or holes are provided in the structure. In this manner the structures are arranged to perform the desired logic, memory and display functions.

DESCRIPTION OF THE PREFERRED EMBODIMENTS

Figure 1:
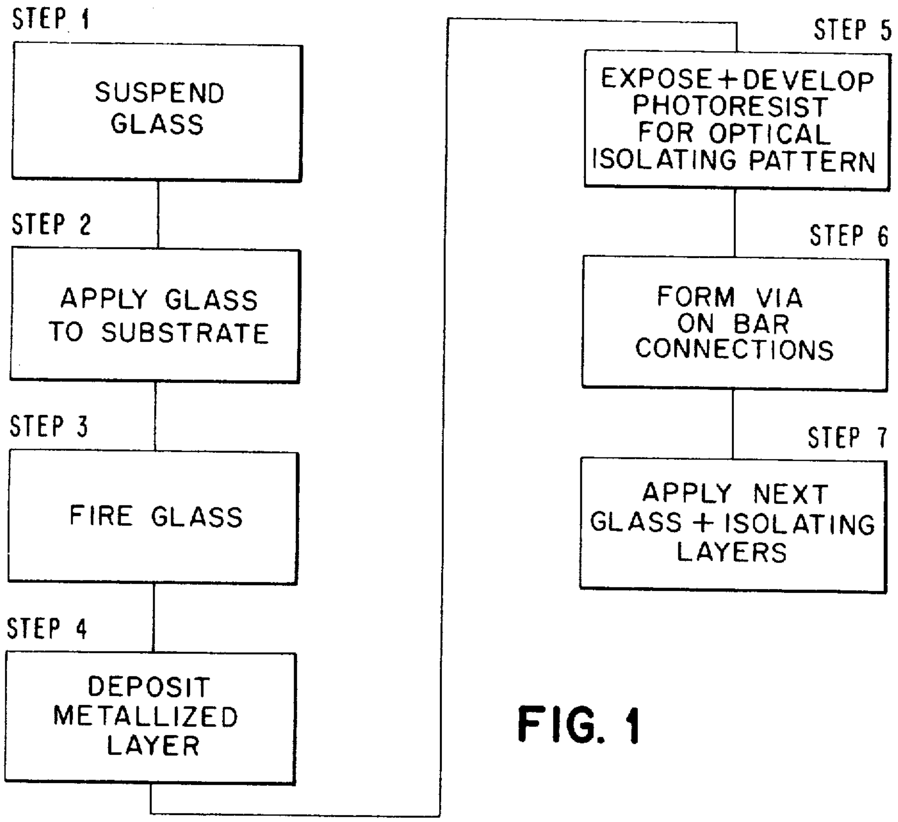
FIG. 1 is a block diagram showing the steps employed in the method for fabricating multilayer monolithic opto-electronic structures.

Referring now to FIG. 1, the opto-electronic monolithic multilayer packages of the invention are fabricated according to these steps. In Step 1, a glass for acting as the optical transmitting material is prepared by suspending it in a liquid of suitable viscosity. The liquid must be such that it evaporates or decomposes without leaving a residue when the glass is fired. Such a liquid is terpineol.

The glass that is utilized may be from the class consisting of in parts by percentage within the ranges:

| | | |
|---|---|---|
| Silicon dioxide | ($SiO_2$) | 55–80% |
| Boron oxide | ($B_2O_3$) | 20–35% |
| Alumina | ($Al_2O_3$) | 0–1% |
| Sodium oxide | ($Na_2O$) | 0–1% |
| Potassium oxide | ($K_2O$) | 0–1% |
| Zirconia | ($ZrO_2$) | 0–1% |
| Magnesium oxide | ($MgO$) | 0–1% |
| Beryllium oxide | ($BeO$) | 0–1% |
| Calcium oxide | ($CaO$) | 0–1% |
| Lithium oxide | ($Li_2O$) | 0–1% |

Preferably, the glass may be 7070 Glass of the Corning Glass Company having a composition in parts by percentage as follows:

| | | |
|---|---|---|
| Silicon dioxide | ($SiO_2$) | 69% |
| Boron oxide | ($B_2O_3$) | 28% |
| Alumina | ($Al_2O_3$) | 1/2% |
| Sodium oxide | ($Na_2O$) | ½% |
| Potassium oxide | ($K_2O$) | 1% |
| Lithium oxide | ($Li_2O$) | 1% |

After suspension of the glass in the liquid, it is applied to a substrate at Step 2. The substrate may be formed of a ceramic material or glass. Alternately, a metallic layer may be used as the substrate if it is desired to have a continuous electrode at the base of the monolithic structure. Application of the glass suspension is performed by any of the methods well-known in the art. Such methods include doctor blading. In this method, a squeegee is used to deposit a slurry on the substrate. Alternatively, the glass suspension may be spray deposited on the substrate.

Firing of the glass is performed in Step 3 in a non-oxidizing atmosphere to avoid oxidizing the metals. A typical firing cycle for the particular class of glass compositions described above, which includes a pre-firing step, is as follows:

five minutes in a hydrogen atmosphere at 750°C;

five minutes in a hydrogen atmosphere at 810°C; and five minutes in a nitrogen atmosphere at 810°C. The structure is then cooled in substantially the same period of time to a room ambient temperature in the presence of forming gas (90% $N_2$ — 10% $H_2$).

The firing cycle is carefully controlled to avoid generating bubbles in the glass. By pre-firing at a temperature somewhat below the softening point of the glass, the glass particles are allowed to sinter preventing the formation of bubbles. At the same time any surface absorbed gases are driven off. After the pre-firing step, the temperature is raised to accelerate the sintering action. The maximum temperature that is reached in the firing cycle never reaches the level at which the viscosity of the glass is low enough to permit movement of any metallic patterns formed on it. Thus, the viscosity is maintained at a level below the fluid state of the glass.

In Step 4, the optical isolating patterns are formed on the glass layer. A blanket evaporation of a metallic layer is deposited on the surface of the glass. The metallic layer is highly reflective to assure minimum light attenuation from the channel and a high level of light conductance. A typical metallic layer is chromium-copper-chromium. In addition to providing optical isolation for portions of the formed optical channels, the metallic layer is subtractively etched to form conductor patterns. The conductor patterns are used when electrical components are fabricated in the monolithic structure as will be described more fully hereinafter.

A photoresist is spin coated over the blanket metallic layer for the etching. It is exposed and developed in Step 5. Eastman Kodak's thin film resist (KTFR) is a typical photoresistive material. The developer may be Eastman Kodak's metal etch resist (KMER). The exposed resist surfaces are then etched. To subtractively etch the top and bottom chromium layers, solutions of 25g of $K_3$ Fe $(CN)_6$, 50g of Na OH and 425 Ml of $H_2O$ (DI) are employed. The copper layer is etched with a solution of KI and $I_2$.

To provide connections from a metallized plane to another metallized plane and to provide the reflecting walls of the optical chambers or channels, vias or bars are provided. The vias or bars are formed in Step 6 by evaporating metal in defined patterns through a mask to the height that the glass channels are to be formed. The patterns conform to the locations where the channels are to be formed. The glass is then applied between the bar elements of the defined patterns in Step 7 in the same manner as applied in Step 2 to the substrate. The glass may be doctor bladed on the structure and thereafter fired and polished to expose the vias or channels. Following this, a metallized layer is deposited over the glass and windows or cut-outs are etched to provide access to the optical channels. The vias can be stacked one on top of another for greater versatility. An alternate method for forming the vias or bars is to plate the metal to the metallized conductor patterns.

Figure 2:
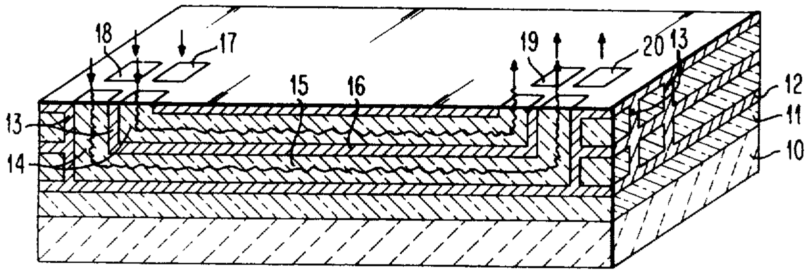
FIG. 2 is a perspective view partially in section of a plural channel package fabricated according to the method of FIG. 1.

In FIG. 2 a typical opto-electronic micro package is shown. The substrate which may be a ceramic, glass or metallic layer is indicated at 10. The first layer of glass is deposited to a thickness in the range of 1 to 5 mils at 11. The metallized layer in blanket form is at 12. Vias or bars 13 define the optical channels. Four optical channels 14 are provided in this structure. It is to be understood that the number of such channels in a monolithic structure depends on the function to be performed. It may be more or less than four as the ultimate use determines. Each of the channels is independent of the others and communicates to the exterior of the structure through cut-outs or windows 17–20.

A second glass layer 15 fills the gaps between the bars and a second metallized layer 16 provides vertical isolation between the channels. By depositing additional bars, glass and metallized layers, the number of channels in the structure is increased permitting a particular logic or memory function to be performed.

The typical dimension of the light channel 14 may be 2 mils by 2 mils, although the channels may have dimensions as large as 10 mils by 10 mils. Without any active devices being included in the structure, light enters the channels at one end through ports 17, 18 and is emitted at the opposite end through ports 19, 20. The metallic material that is employed as the optical isolating material is reflective to assure that the light is conducted in the channels with a minimum attenuation.

Figure 3A:
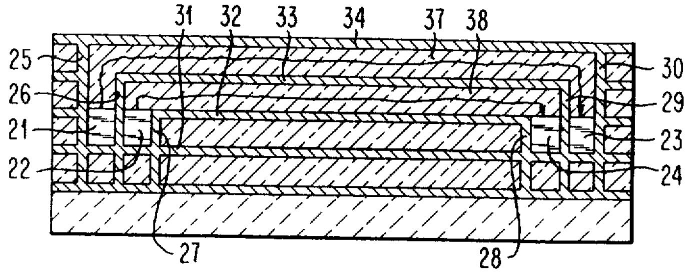
FIGS. 3*a* and 3*b* are views in section and partially in section of the side and top, respectively, of a plural channel EL–PC package fabricated according to the method of FIG. 1.
Figure 3B:
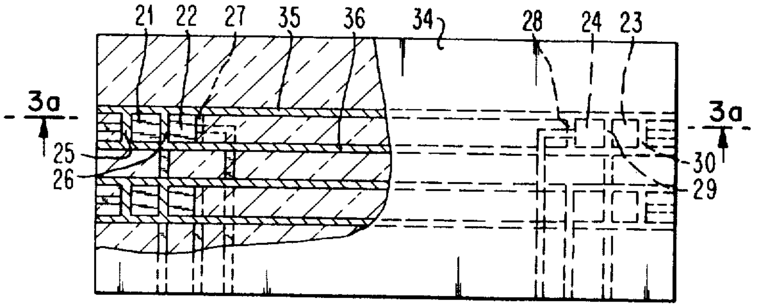

Referring now to FIGS. 3*a* and 3*b*, electroluminescent and photoconductive devices are included within the glass layers of the monolithic structure as it is fabricated. In the monolithic package shown, electroluminescent elements 21, 22 and photoconductor elements 23, 24 are included in the spaces formed by bars 25, 26, 27 and 28, 29, 30, respectively, and vertical isolating layers 31–34. Isolating layer 34 is continuous to provide a cover for the package. Intermediate metallized layers at 31, 32, 33 provide vertical isolation. Bars 35, 36 provide horizontal isolation. Thus, optical channels 37, 38 are defined to provide communication between electroluminescent devices 21, 22 and photoconductive devices 23, 24.

The metallized layers and bars act as electrical conductors to connect to the outside of the structure and thus to act as the electrodes for the devices. Bar 26 is common to both of the devices 21, 22 and bar 29 to devices 23, 24. To activate an electroluminescent device, for example device 21, bar 25 which connects to the exterior of the monolithic structure has an electrical voltage applied to it. This signal together with the voltage on common bar 26 causes device 21 to emit light. The light is conducted through channel 37 to photoconductive device 23. A drop in resistance occurs across device 23 which has suitable detection circuitry (not shown) connected to common bar 29 and bar 30.

In similar manner any of the other opto-electronic circuits may be activated. Although the individual devices are shown as connected to a common bar and also to individual bars, it is readily apparent that such connections are provided only by way of example. The connections to the devices could just as readily be discrete and individual bars or a plurality of either or both the electroluminescent and photoconductive devices could be connected in common for simultaneous activation. As is apparent, the type of such connections and the manner of making them are all within the purview of the method of this invention.

Figure 4:
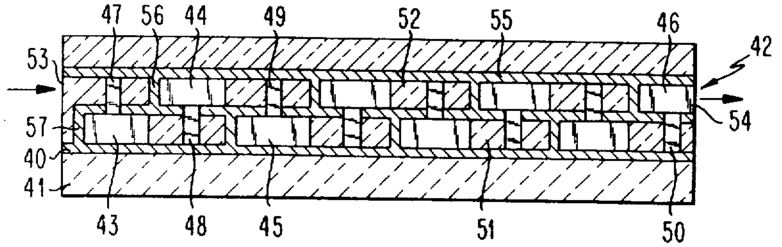
FIG. 4 is a sectional view of plural stage light amplifier fabricated according to the method of FIG. 1.

In FIG. 4, a light amplifier may be fabricated employing the method of this invention. A metallized layer 40 is deposited on a substrate 41. A predetermined pattern of vias or bars 42 is formed in two layers on layer 40. Within pattern 42, an alternating arrangement is formed within glass layers 51, 52 of electroluminescent (EL) devices 43, 44, 45, 46 and photoconductive (PC) devices 47, 48, 49, 50. Metallized layer 55 acts as a second common electrical conductor for the amplifier. By the bar connectors 56, 57 each of the devices 43-50 is connected across the common conductors 40 and 55. An entrance port 53 and an exit port 54 are provided for the light.

In the structure of FIG. 4 vertical light coupling is used for EL–PC devices 43–50. Eight stages of the amplifier are horizontally coupled. Light enters port 53 and a drop in resistance occurs across device 47 causing device 43 to be activated emitting light. The light from device 43 is incident on device 48 and the process is repeated until light is emitted in amplified form through port 54. It has been determined that the amplification that occurs in each stage approximates 1.3.

It is also possible in constructing monolithic opto-electronic packages to employ optical semiconducting devices such as photoemitting and photodetecting diodes. These elements may be inserted through windows formed in the metallized layers after the structure is fabricated.

While this invention has been particularly described with reference to the preferred embodiments thereof, it will be understood by those skilled in the art that the foregoing and other changes in form and details may be made therein without departing from the spirit and scope of the invention.

What is claimed is:

1. A method of fabricating monolithic multi-channel light conducting structures on a substrate comprising the steps of:
   depositing alternate layers of optical transmitting material and optical reflecting isolating material first on said substrate and then on each other,
   firing said structure after each deposition of a layer of optical transmitting material,
   forming defined patterns of optical isolators on and transverse to said optical isolating layers prior to the deposition of predetermined ones of said optical transmitting layers to provide a plurality of light conducting channels, and
   deleting predetermined portions of said optical isolating layers to provide communicating windows to and within predetermined ones of said channels.

2. The method of claim 1, wherein the optical transmitting material is glass which is applied to the substrate and reflecting isolating material.

3. The method of claim 2, wherein the firing is performed in a non-oxidizing atmosphere.

4. The method of claim 3, wherein the firing cycle for each glass deposition comprises the steps of:

pre-firing said structure at a temperature below the softening point of the glass in a hydrogen atmosphere, a firing the structure at a temperature sufficient to maintain the viscosity of the glass at a level below the fluid state of the glass, first in a hydrogen atmosphere and then in a nitrogen atmosphere, and cooling the structure to room ambient temperature in the presence of forming gas.

5. The method of claim 2, wherein the optical reflecting and isolating material is metallic for serving as electrical conductors.

6. The method of claim 5, and further comprising the step of positioning illuminating means and photodetection means at respective ends of at least one of said channels in contact with predetermined ones of said conductors.

* * * * *